United States Patent
Zounes

(10) Patent No.: US 6,680,622 B2
(45) Date of Patent: Jan. 20, 2004

(54) METHOD AND SYSTEM FOR DISABLING A SCANOUT LINE OF A REGISTER FLIP-FLOP

(75) Inventor: Thomas David Zounes, Carlsbad, CA (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 10/146,407

(22) Filed: May 14, 2002

(65) Prior Publication Data

US 2003/0214318 A1 Nov. 20, 2003

(51) Int. Cl.[7] .................. H03K 19/00; H03K 3/289
(52) U.S. Cl. ............................ 326/16; 327/202
(58) Field of Search ..................... 326/16; 327/202, 327/203, 208–212, 218; 714/726, 729

(56) References Cited

U.S. PATENT DOCUMENTS

| 4,495,629 A | * | 1/1985 | Zasio et al. ............. 377/70 |
| 4,602,210 A | * | 7/1986 | Fasang et al. ........... 714/731 |
| 5,444,404 A | * | 8/1995 | Ebzery .................. 327/185 |
| 5,668,490 A | * | 9/1997 | Mitra et al. ............ 327/203 |
| 6,380,780 B1 | * | 4/2002 | Aitken et al. .......... 327/202 |

* cited by examiner

Primary Examiner—James H. Cho
(74) Attorney, Agent, or Firm—Lisa K. Jorgenson; Andre Szuwalski

(57) ABSTRACT

A method and apparatus for disabling the scan output of flip-flops contained within an integrated circuit. Registers within the integrated circuit form a serial shift register chain when in the test mode of operation. The registers contain therein flip-flops, each of the flip-flops having at least one data input, a scan test input, a data output, and a scan output. The flip-flop is capable of storing either the signal appearing on the at least one data input or the signal appearing on the scan test input, based on the mode of operation of the flip-flop. The flip-flop includes a circuit coupled between the data output and the scan output for selectively disabling the scan output from following the value of the data output. Consequently, the scan output is enabled to output the logic value stored in the flip-flop when the flip-flop is in the test mode of operation and is disabled from outputting the logic value stored in the flip-flop when the flip-flop is in the normal mode of operation. When the scan output is disabled from following the data output, the scan output is driven to a predetermined logic value.

12 Claims, 4 Drawing Sheets

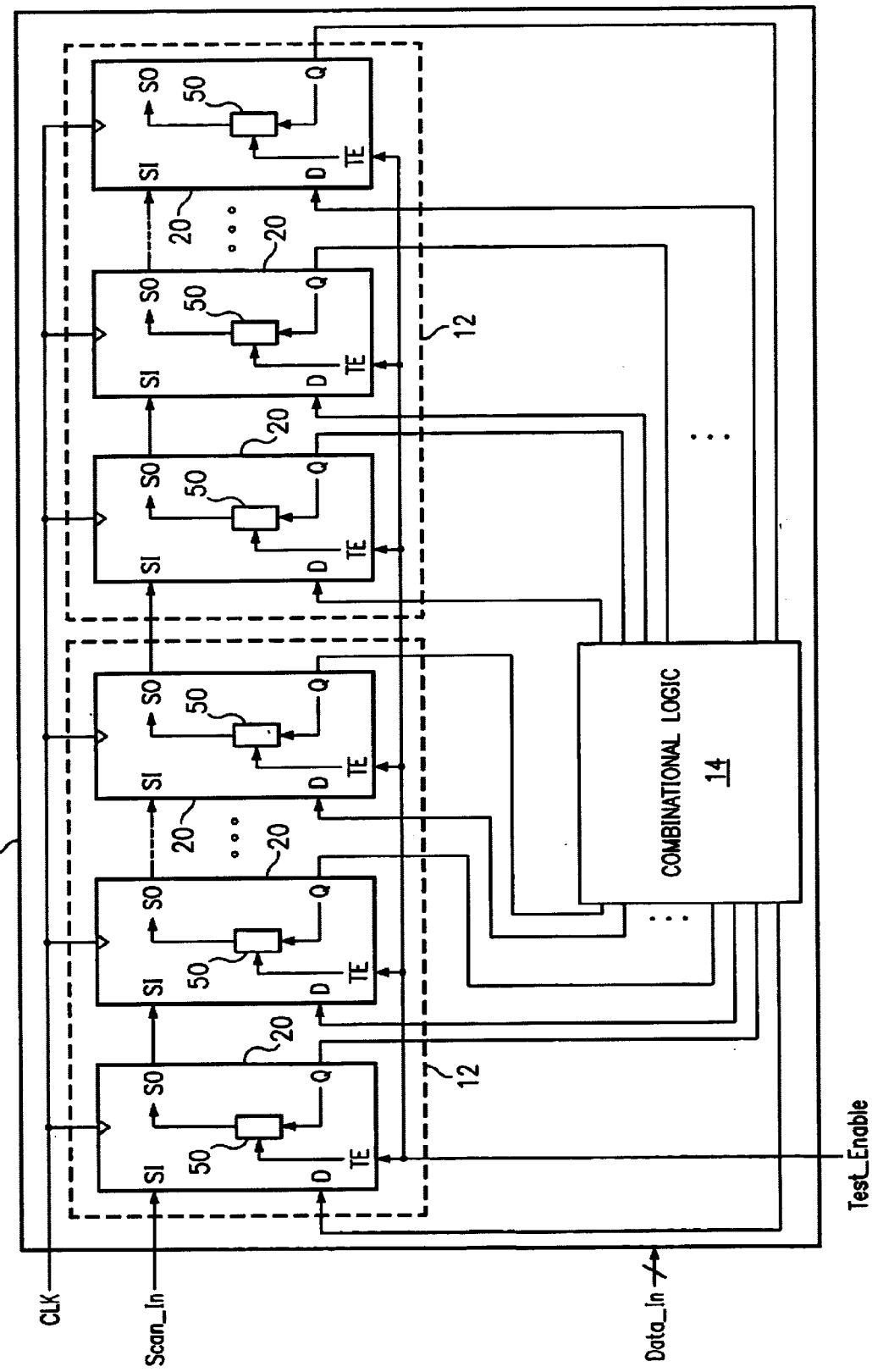

METHOD AND SYSTEM FOR DISABLING A SCANOUT LINE OF A REGISTER FLIP-FLOP

BACKGROUND OF THE INVENTION

1. Technical Field of the Invention

The present invention is generally related to registers having serial scan capabilities and, in particular, to selectively disabling a scan output of flip-flops forming the registers.

2. Description of Related Art

Testing of integrated circuits has become a vital operation during the manufacturing, packaging, and the active life of the integrated circuits. However, due to the complexity of integrated circuits and the implementation of the integrated circuits using Very Large Scale Integration (VLSI) processing, the accessibility of every node within the integrated circuit has become difficult and almost impossible without employment of suitable design for test techniques.

A number of design for test (DFT) techniques exist which improve the controllability and/or observability of the internal nodes within an integrated circuit (IC) chip. One known DFT technique for synchronous digital integrated circuits is a serial scan test technique. According to the serial scan test technique, the integrated circuit chip is selectively configured into a test mode of operation wherein the registers in the integrated circuit chip are configured as at least one serial shift register chain having an input and an output externally accessible from outside the integrated circuit chip. In general terms, a test input signal pattern is shifted in the serial shift register chain, the registers are then configured into a normal mode of operation, one or more clock pulses occur, the registers are reconfigured in the test mode of operation, and the new values stored in the registers are shifted out of the serial shift register while a new test input signal pattern is shifted therein. The scan output of the serial shift register is monitored and compared to expected data. These steps are repeated until a desired fault coverage level of the IC chip has occurred.

Conventional register flip-flops include a clock input, at least one data input, and at least one data output. Conventional register flip-flips having serial scan capability may include a scan input, a scan output, and a test enable input which are utilized in the testing operation. The scan output of the flip-flop typically follows the data output or the logical inverse thereof This is acceptable when the flip-flop is configured in the test mode of operation. However, when in the normal mode of operation, the scan output is not typically used and thus will needlessly dissipate power when following the data output signal. Moreover, the scan output will undesirably generate noise when toggling between logic states, which may affect others components and signals in the integrated circuit chip. Based on the foregoing, there is a need for an improved register flip-flop having serial scan capabilities.

SUMMARY OF THE INVENTION

The present invention describes an integrated circuit that is configured to operate in a normal mode of operation and a test mode of operation. The registers within the integrated circuit form a serial shift register chain when in the test mode of operation. The registers contain therein flip-flops, each of the flip-flops having at least one data input, a scan test input, a data output, and a scan output. The flip-flop is capable of storing either the signal appearing on the at least one data input or the signal appearing on the scan test input, based on the mode of operation of the flip-flop. The flip-flop includes a circuit coupled between the data output and the scan output for selectively disabling the scan output from following the value of the data output. Consequently, the scan output is enabled to output the logic value stored in the flip-flop when the flip-flop is in the test mode of operation and is disabled from outputting the logic value stored in the flip-flop when the flip-flop is in the normal mode of operation. When the scan output is disabled from following the data output, the scan output is driven to a predetermined logic value. Thus, by disabling the scan output from following the value of the data output during the normal mode of operation and causing the scan output to be at a fixed logic level, the power dissipation caused by the unnecessary toggling of the scan output is substantially eliminated and the noise produced in the integrated circuit chip is reduced.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 2 illustrates a more detailed view of the integrated circuit chip of FIG. 1.

DETAILED DESCRIPTION OF THE INVENTION

The numerous innovative teachings of the present application will be described with particular reference to the exemplary embodiments. However, it should be understood that the exemplary embodiments provide only a few examples of the many advantageous uses of the innovative teachings herein.

Figure 1:
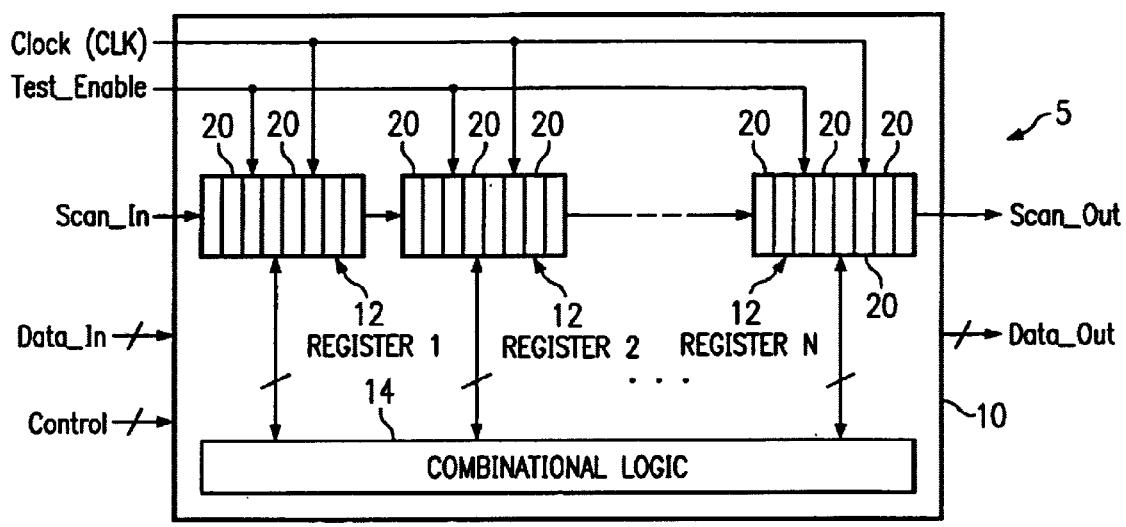
FIG. 1 illustrates an integrated circuit chip having registers therein according to an exemplary embodiment of the present invention.

Referring to FIG. 1, there is illustrated an integrated circuit chip 10 within a system 5. The integrated circuit chip 10 may contain therein a number of registers 12. Each one of the registers 12 may contain therein register flip-flops 20. The registers 12 shown in FIG. 1 are depicted as 8-bit registers but it should be understood that each register 12 may contain a different number of bits. The registers 12 are coupled to combinational logic 14 that may contain therein logic gates and/or other logic circuitry. The integrated circuit chip 10 may further include one or more data input signals (Data_In), one or more data output signals (Data_Out) and one or more control input signals (Control). It is understood that the particular structural relationship between registers 12, combinational logic 14, the data input signals (Data_In), and the data output signals (Data_Out) depends on the desired operation of the integrated circuit chip 10.

The integrated circuit chip 10 is configurable into a test mode of operation and a normal mode of operation. When in the normal mode of operation, the integrated circuit chip 10 receives data input signals (Data_In), performs internal computations using the registers 12 and the combinational logic 14, and generates signals on data output signals (Data_Out). The integrated circuit chip 10 also receives a clock signal (CLK) that is connected to each register flip-flop 20 within the registers 12. For reasons of simplicity, each register flip-flop 20 within the registers 12 is connected to the same clock signal (CLK). It is understood, however, that registers 12 may receive different clock signals. Moreover, the integrated circuit chip 10 may receive at least one control signal (Control) that may be used to control the operation of the integrated circuit chip 10.

In addition, the integrated circuit chip 10 may have a scan input signal (Scan_In), a scan output signal (Scan_Out), and a test enable signal (Test_Enable). When the integrated circuit chip 10 is configured in the test mode of operation, the registers 12 form at least one serial shift register chain to allow for a serial input test pattern to be shifted therein through the scan input signal (Scan_In) and a serial output test pattern to be shifted out through the scan output signal (Scan_Out). The test enable signal (Test_Enable) is utilized to configure the integrated circuit chip 10 into and out of the test mode of operation.

Referring now to FIG. 2, there is illustrated an exemplary embodiment of first and second registers 12 of the integrated circuit chip 10. It should be understood that the flip-flops 20 within the other registers 12 of the integrated circuit chip 10 may have substantially the same configuration as illustrated herein for the first and second registers 12. The flip-flops 20 depicted and described hereinbelow are D-type flip-flops and it should be understood that other types of flip-flops may be utilized in registers 12.

The flip-flops 20 within the registers 12 may have their data input (D) and data output (Q) connected to the combinational logic 14. The combinational logic 14 may contain one or more logical components such as logic gates, wires, etc. that determine the operation of the integrated circuit chip 10. Combinational logic 14 may be connected to one or more registers 12 within the integrated circuit chip 10. For example, the data output (Q) of a flip-flop 20 may be connected to the data input (D) of another flip-flop 20 through a circuit path in the combinational logic 14 that may include a logic gate, a plurality of logic gates, or merely a wire segment.

Each flip-flop 20 includes a test enable terminal (TE) that determines whether the flip-flop 20 is configured in the test mode of operation or normal mode of operation. The test enable terminal (TE) is connected to the test enable signal (Test_Enable) to receive a mode configuration signal therefrom that configures each flip-flop 20 in either one of the two modes of operation. The flip-flops 20 are coupled together using the scan inputs (SI) and scan outputs (SO) thereof The scan output (SO) of one flip-flop 20 may be connected to the scan input (SI) of another flip-flop 20. This connection of the scan output (SO) of one flip-flop 20 to the scan input (SI) of a next flip-flop 20 is repeated for the flip-flops 20 within each of the registers 12 and also between different registers 12 so as to form at least one serial shift register chain. When the integrated circuit chip 10 is configured in the test mode of operation, data may be serially shifted into the registers 12 using the serial shift register chain. Data shifted in the registers 12 will propagate through the flip-flops 20 within the registers using the connections between the scan outputs (SO) and the scan inputs (SI) of the flip-flops 20. The data may also be shifted out of the serial shift register through the scan output signal (Scan_Out) of the integrated circuit chip 10.

Figure 3:
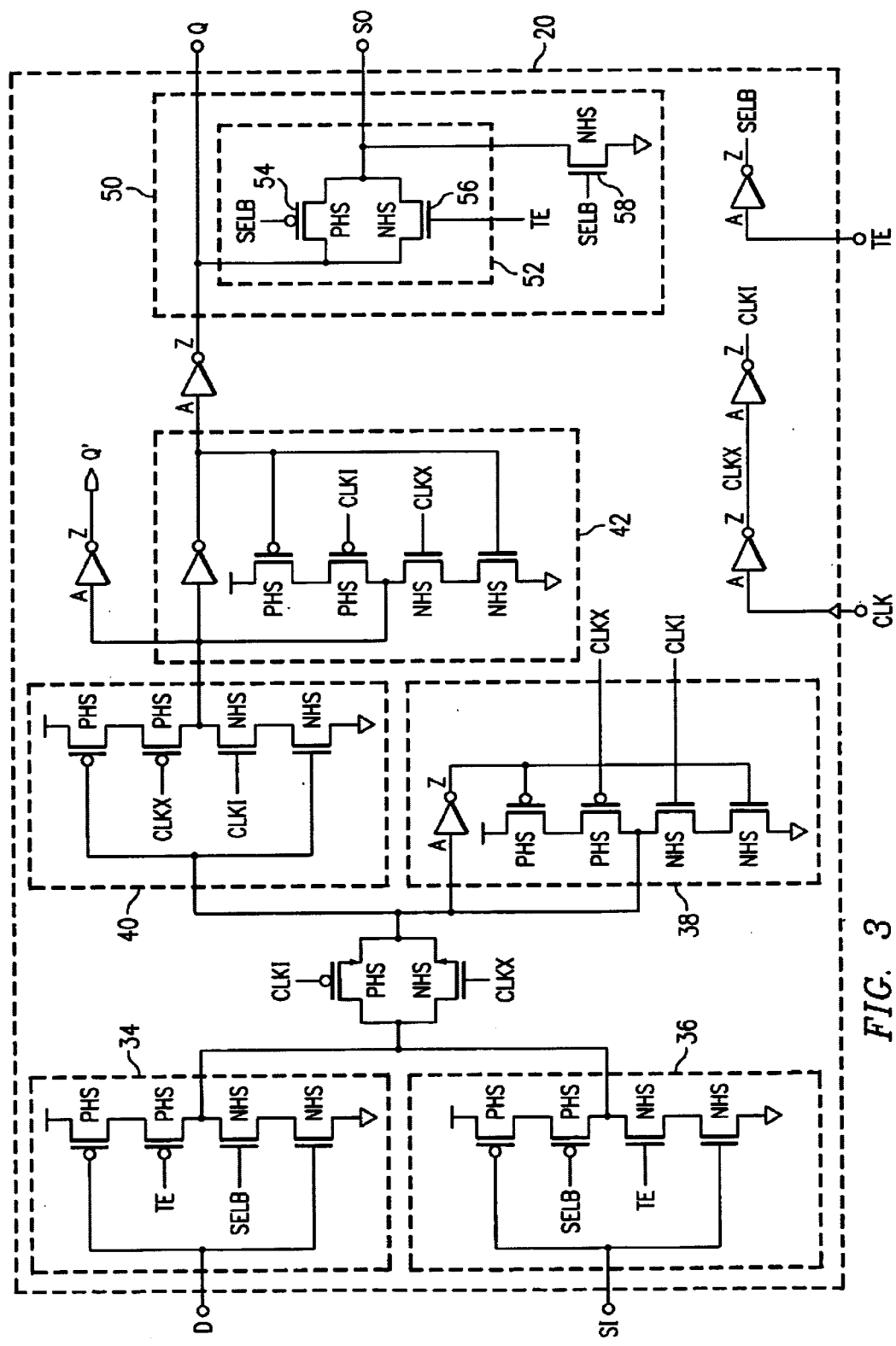
FIG. 3 illustrates an exemplary embodiment of a flip-flop of the integrated circuit chip of FIG. 2, according to the teachings of the present invention.

FIG. 3 illustrates an exemplary embodiment of the flip-flop 20 according to an exemplary embodiment of the present invention. The flip-flop 20 contains therein a master latch 38 and a slave latch 42. The master latch 38 receives the signal applied to the data input (D) when in a normal mode of operation (TE being in a logic low state) and the signal applied to the scan input (SI) when in a test mode of operation (TE being in the logic high state). It should be understood that TE may be inverted in certain implementations of the flip-flop such that when the test enable terminal (TE) has a low logic value thereon, the flip-flop 20 is in the test mode of operation and when the test enable terminal (TE) has a high logic value thereon, the flip-flop is in the normal mode of operation. The master latch 38 is updated (i.e., receives the signal on either D or SI) when clock signal (CLK) is at a logic low value. The master latch 38 stores and/or latches either the signal appearing on data input (D) or scan input (SI) when the clock signal (CLK) is at a high logic value.

The slave latch 42 is coupled to the master latch 38 and receives the logical inverse of the value stored in the master latch 38 when the clock signal (CLK) is at a high logic value. The received value is then stored or latched in the slave latch 42 when the clock signal (CLK) is at a logic low value. Thus, a data output (Q), which is coupled to the slave latch 42, may change state on the rising edge of the clock signal (CLK). It should be understood that other circuit configurations of the flip-flop 20 may be implemented that are capable of performing the functions described hereinabove.

Unlike in conventional designs, a scan output (SO) of flip-flop 20 does not always follows the data output (Q) (or the logical inverse of the data output (Q'), depending on the design). Rather, flip-flop 20 includes a scan output enable/disable circuit 50 (FIGS. 2 and 3) which enables the scan output (SO) to follow the data output (Q) during the test mode of operation (TE being at a high logic value) and disables the scan output (SO) from following the data output (Q) during the normal mode of operation (TE being at a low logic value). The scan output enable/disable circuit 50 is coupled between the data output (Q) and the scan output (SO) of the flip-flop 20. In an exemplary embodiment of the present invention, the circuit 50 includes a pass-gate circuit 52 and a pull down transistor 58. The pass-gate circuit 52 is activated to enable the scan output (SO) to follow the data output (Q) when the flip-flop 20 is in the test mode of operation, i.e., when a high logic value appears on the test enable terminal (TE). However, when the flip-flop 20 is in the normal mode of operation (TE being at a low logic value), the pass-gate circuit 52 is deactivated to disable the scan output (SO) from following the data output (Q). In an exemplary embodiment of the present invention, the pass-gate circuit 52 includes two transistors, a PMOS transistor 54 and a NMOS transistor 56, coupled between the data output (Q) and the scan output (SO). The gate/control terminal of the NMOS transistor 56 is coupled to the test enable terminal (TE), and the gate/control terminal of the PMOS transistor 54 is coupled to the logical inverse of the test enable terminal (TE). The pull down transistor 58 is connected between the scan output (SO) of the flip-flop 20 and a predetermined voltage level, i.e., ground. The gate/control terminal of the pull down transistor 58 is coupled to the logical inverse of the test enable terminal (TE). The pull down transistor 58 is operable to pull the scan output (SO) to a predetermined logic value, i.e., a low logic value, when the flip-flop 20 is in the normal mode of operation and the pass-gate circuit 52 is deactivated. However, when the flip-flop 20 is in the test mode of operation (TE being at a high logic value), the pull down transistor 58 is deactivated.

It should be understood that a pull up transistor may be utilized instead of the pull down transistor 58 which will selectively drive the scan output (SO) to a high logic value. It should also be understood that other configurations of a pass-gate circuit 52 and a pull down transistor 58 may be implemented. For example, a logic AND gate may be utilized that has an input coupled to the data output (Q) of the flip-flop 20, a second input coupled to the test enable terminal (TE), and an output coupled to the scan output (SO). In this way, the scan output (SO) follows the data output (Q) when the flip-flop 20 is configured in the test mode of operation and is fixed at a predetermined value (i.e., the logic low value) when the flip-flop 20 is in the normal mode of operation.

By disabling the scan output (SO) from following the data output (Q) and instead driving it to the predetermined logic level during the normal mode of operation, the scan output (SO) does not toggle so that less power is dissipated by the integrated circuit chip 10. Moreover, less noise is generated within the integrated circuit chip 10 due to the scan output (SO) being prevented from toggling between logic states.

It should be understood that driving of the scan output (SO) of flip-flop 20 to the predetermined logic value may not be necessary depending on the particular implementation of the integrated circuit and particularly flip-flop 20. For example, if the scan output (SO) of each flip-flop 20 is only connected to the scan input (SI) of another flip-flop 20 implemented as shown in FIG. 3, then driving the scan output (SO) to any predetermined logic value may not be necessary since the scan input (SI) is prevented by circuit 36 of flip-flop 20 from creating a current path in flip-flop 20 between a power supply and a ground reference due to the scan input (SI) being at an intermediate voltage level.

Figure 4:
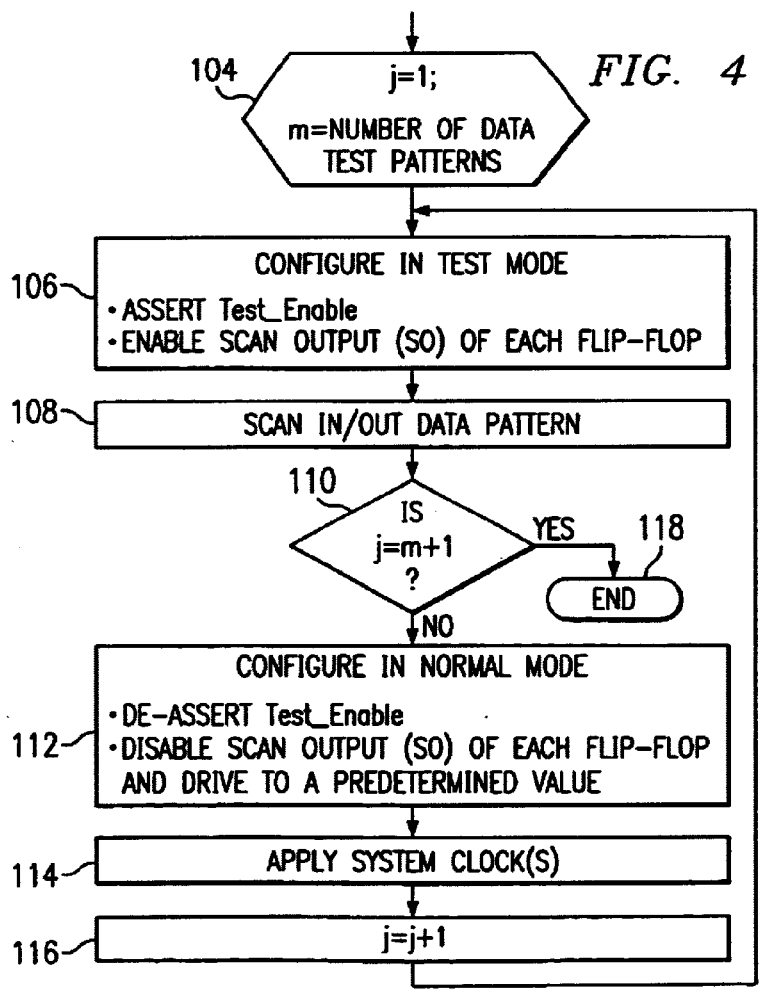
FIG. 4 is a flow diagram illustrating an operation of the integrated circuit chip of FIG. 1, according to an exemplary embodiment of the present invention.

Turning now to FIG. 4, there is illustrated a flow diagram of an operation of the integrated circuit chip 10 of FIG. 1. As described hereinabove, a number of test patterns are required to achieve a desired fault coverage level for the integrated circuit chip 10. Each test pattern is specifically formulated to test one or more elements and/or connections in the integrated circuit chip 10. To perform the testing operation, the integrated circuit chip 10 is first configured in the test mode of operation (step 106). This is performed by asserting the test enable signal (Test_Enable), i.e., providing a high logic value on the test enable signal (Test_Enable), which activates the pass-gate circuit 52 in flip-flops 20 so that, for each flip-flop 20, the scan output (SO) follows the data output (Q). The assertion of the test enable signal (Test_Enable) also configures registers 12 to form at least one serial shift register. The first test pattern is then serially loaded into the register bits, i.e., flip-flips 20, of the registers 12 within the integrated circuit chip 10 (step 108) through the scan input signal Scan_In. The integrated circuit chip 10 is then configured in the normal mode of operation (step 112). This is performed by de-asserting the test enable signal (Test_Enable). The test enable signal (Test_Enable) now being at a low logic value will cause the test enable terminal (TE) of each flip-flop 20 to be at a low logic level. For each flip-flop 20, this disables the scan output (SO) from following the data output (Q) by turning off the pass-gate circuit 52, and enables the pull down transistor 58 to drive the scan output (SO) to the predetermined value, i.e., the low logic value. A clock pulse on clock signal (CLK) is then applied (step 114) which causes each flip-flop 20 to load data appearing at the data input (D) terminal of each flip-flop 20. At this point, the registers 12 have been updated with new values based upon the particular implementation of the combinational logic 14 and the relationship between the combinational logic 14, registers 12 and the signal values applied to the data input signals (Data_In).

The integrated circuit chip 10 is again configured in the test mode of operation (step 106) and the values stored in the register bits, upon application of pulses on clock signal (CLK), are shifted out (step 108) through the scan output signal (Scan_Out). The scan output signal (Scan_Out) is examined and compared to expected output values. During the shifting out of the stored values (step 108), a new data pattern is serially shifted in the register bits. The examination of various test patterns improve the controllability and/or observability of the internal nodes within the integrated circuit chip 10. Once all the test patterns required to achieve the desired fault coverage level have been used in the testing of the integrated circuit chip 10, the testing operation is terminated.

Figure 5:
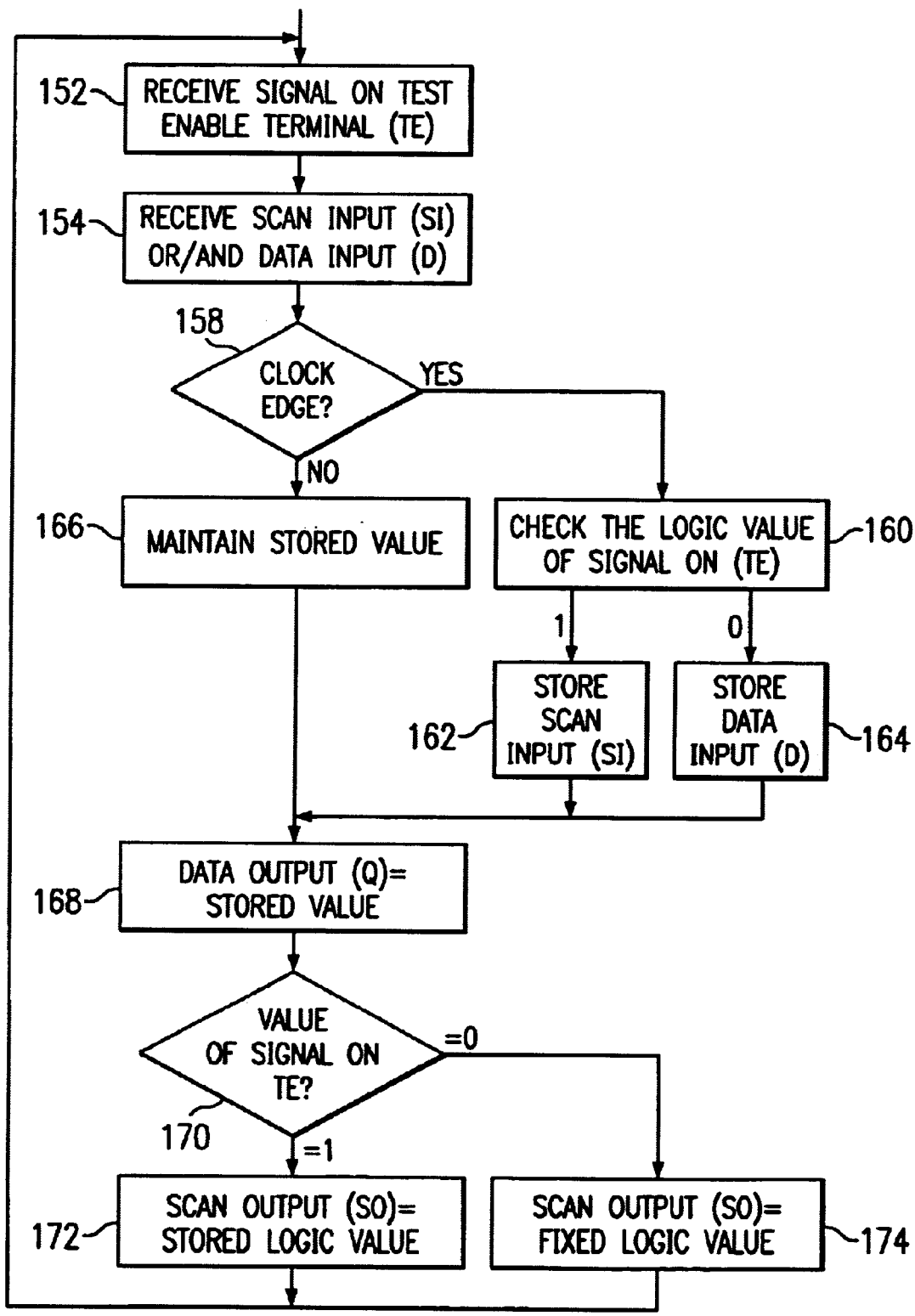
FIG. 5 is a flow diagram illustrating an operation of the flip-flop of FIG. 3 according to an exemplary embodiment of the present invention.

FIG. 5 is a flow diagram illustrating an operation of the flip-flop 20 according to the exemplary embodiment of the present invention. The flip-flop 20 receives via circuit 36 a signal appearing on scan input (SI) when in the test mode of operation and a signal appearing on scan data input (D) via circuit 34 when in the normal mode of operation (step 154). If test enable terminal (TE) has a high logic value, the occurrence of a rising edge appearing on clock signal (CLK) (step 158) causes flip-flop 20 to store the signal appearing on the scan input (SI) (step 162). However, if the signal appearing on the test enable terminal (TE) is at a low logic value during the occurrence of a rising edge of the clock signal (CLK), the signal appearing on the data input (D) is stored in the flip-flop 20 (step 164). The stored value in the flip-flop 20 is outputted to the data output (Q)(step 168). It should be understood that in the implementation of flip-flop 20 of FIG. 3, the rising edge of the clock signal (CLK) is utilized whereas in other configurations of the flip-flop the falling edge of the clock may be utilized to trigger the storing operation.

The scan output (SO) of the flip-flop 20 follows the data output (Q) thereof and outputs the stored value maintained by the flip-flop 20 (step 172) if the flip-flop is configured in the test mode of operation, i.e., a high logic value appearing on the test enable terminal (TE). However, the scan output (SO) is disabled from following the data output (Q) and is instead fixed at a predetermined logic value (step 174) if the flip-flop is configured in the normal mode of operation, i.e., a low logic value appearing on the test enable terminal (TE). This process is repeated for each received input signal.

A scan output (SO) within the flip-flop 20 follows the data output (Q) when the flip-flop 20 is configured in the test mode of operation, so as to be capable of forming a serial shift register chain. When in the normal mode of operation, the scan output (SO) is not needed and thus is disabled from following the data output (Q) or otherwise toggling, thereby reducing power dissipated by the flip-flop 20 and reducing noise levels within the integrated circuit chip 10.

Although exemplary embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A flip-flop comprising:
a mode configuration input for receiving a test enable signal for configuring the flip-flop between a test mode of operation and a normal mode of operation;

at least one data input for receiving at least one data signal, said flip-flop being capable of storing the at least one data signal when the flip-flop is in the normal mode of operation;

a data output for providing externally to the flip-flop the value stored in the flip-flop;

a scan input for receiving a test data signal, said flip-flop being capable of storing the test data signal when the flip-flop is in the test mode of operation;

a scan output; and a circuit for enabling the scan output to output the logic value stored in the flip-flop when the flip-flop is in the test mode of operation and for disabling the scan output from outputting the logic value stored in the flip-flop when the flip-flop is in the normal mode of operation, the circuit comprising a pair of transmission gate transistors, a first transistor of the pair of transmission gate transistors having a first conduction terminal coupled to the data output and a second conduction terminal coupled to the scan output, a second transistor of the pair of transmission gate transistors having a first conduction terminal coupled to the data output and a second conduction terminal coupled to the scan output, each of the pair of transmission gate transistors having a control terminal coupled to the mode configuration input such that the pair of transmission gate transistors are activated when the flip-flop is in the test mode of operation and are deactivated when the flip-flop is in the normal mode of operation.

2. The flip-flop of claim 1, further comprising at least one latch, said circuit being coupled between the scan output and the at least one latch.

3. The flip-flop of claim 1, wherein the circuit drives said scan output to a predetermined logic value when the flip-flop is in the normal mode of operation.

4. The flip-flop of claim 3, wherein the circuit comprises a pull down transistor coupled to the scan output for selectively driving the scan output to a low logic value.

5. The flip-flop of claim 3, wherein the circuit comprises a pull up transistor coupled to the scan output for selectively driving the scan output to a high logic value.

6. The flip-flop of claim 1, wherein the flip-flop is a D-flip-flop.

7. The flip-flop of claim 1, wherein the first conduction terminal of each transistor in the pair of transmission gate transistors is connected to the data output and the second conduction terminal of each transistor in the pair of transmission gate transistors is connected to the scan output.

8. An integrated circuit configured to operate in a normal mode of operation and a test mode of operation, said integrated circuit comprising:

a plurality of registers selectively connected together to form at least one serial shift register when the integrated circuit is configured in the test mode of operation, each of the registers including at least one flip-flop, said at least one flip-flop within each of the registers including at least a test enable input, a scan input, a data input, a scan output and a data output;

a combinational logic circuit for receiving as input the data output of the at least one flip-flop within a first of the registers and for generating a signal coupled to the data input of the at least one flip-flop within a second of the registers;

wherein the at least one flip-flop in each of the registers is enabled for storing the signal appearing on the scan input of the at least one flip-flop and disabled from storing the signal appearing on the data input of the at least one flip-flop when the integrated circuit is in the test mode of operation, disabled from storing the signal appearing on the scan input of the at least one flip-flop and enabled for storing the signal appearing on the data input of the at least one flip-flop when the integrated circuit is in the normal mode of operation, and enabled to output a logic value stored by the at least one flip-flop on the scan output of the at least one flip-flop when in the test mode of operation and disabled from outputting on the scan output the logic value stored by the at least one flip-flop when in the normal mode of operation;

wherein said at least one flip-flop of each register comprises a pair of transmission gate transistors, a first transistor of the pair of transmission gate transistors having a first conduction terminal coupled to the data output and a second conduction terminal coupled to the scan output of the flip-flop, a second transistor of the pair of transmission gate transistors having a first conduction terminal coupled to the data output and a second conduction terminal coupled to the scan output of the flip-flop, each of the pair of transmission gate transistors having a control terminal coupled to a configuration control signal such that the pair of transmission gate transistors are activated when the flip-flop is in the test mode of operation and are deactivated when the flip-flop is in the normal mode of operation.

9. The integrated circuit of claim 8, wherein the scan output of the at least one flip-flop of each register is driven to a predetermined logic value when in the normal mode of operation.

10. The integrated circuit of claim 9, wherein the at least one flip-flop of each register comprises a transistor coupled to the scan output for driving the scan output to the predetermined logic value.

11. The integrated circuit of claim 10, wherein the transistor coupled to the scan output includes a first conduction terminal coupled to the scan output, a second conduction terminal coupled to a reference voltage level corresponding to the predetermined logic value, and a control terminal coupled to the configuration control signal.

12. A system, comprising:

a plurality of logic gates; and a plurality of flip-flops coupled to the logic gates, each flip-flop comprising:

a mode configuration input for receiving a test enable signal for configuring the flip-flop between a test mode of operation and a normal mode of operation;

at least one data input for receiving at least one data signal, the flip-flop being capable of storing the at least one data signal when the flip-flop is in the normal mode of operation;

a data output for providing externally to the flip-flop the value stored in the flip-flop;

a scan input for receiving a test data signal, the flip-flop being capable of storing the test data signal when the flip-flop is in the test mode of operation;

a scan output; and a circuit for enabling the scan output to output the logic value stored in the flip-flop when the flip-flop is in the test mode of operation and for disabling the scan output from outputting the logic value stored in the flip-flop when the flip-flop is in the normal mode of operation, the circuit comprising a pair of transmission gate transistors, a first transistor of the pair of transmission gate transistors having a first conduction terminal coupled to the data output and a second conduction terminal coupled to the scan output, a second transistor of the pair of transmission gate transistors having a first conduction terminal coupled to the data output and a second conduction terminal coupled to the scan output, each of the pair of transmission gate transistors having a control terminal coupled to the mode configuration input such that the pair of transmission gate transistors are activated when the flip-flop is in the test mode of operation and are deactivated when the flip-flop is in the normal mode of operation.

\* \* \* \* \*